(12) United States Patent
Yu et al.

(10) Patent No.: US 8,510,938 B2
(45) Date of Patent: Aug. 20, 2013

(54) METHOD FOR ASSEMBLING CAMERA MODULE

(75) Inventors: Chien-Nan Yu, Taipei (TW);
Chung-Feng Tsao, Taipei (TW);
Hang-Kau Khor, Taipei (TW);
Wen-Chi Shih, Taipei (TW);
Ying-Chieh Chen, Taipei (TW);
Yu-Hsiao Li, Taipei (TW)

(73) Assignee: Primax Electronics, Ltd., Taipei (TW)

( * ) Notice: Subject to any disclaimer, the term of this patent is extended or adjusted under 35 U.S.C. 154(b) by 306 days.

(21) Appl. No.: 12/951,245

(22) Filed: Nov. 22, 2010

(65) Prior Publication Data
US 2012/0084976 A1    Apr. 12, 2012

(30) Foreign Application Priority Data

Oct. 8, 2010    (TW) .............................. 99134350 A

(51) Int. Cl.
*H01R 9/00*    (2006.01)
*H05K 3/00*    (2006.01)

(52) U.S. Cl.
USPC ............................................. 29/844; 29/830

(58) Field of Classification Search
USPC ........... 29/844, 830, 832, 879, 884; 257/690, 257/737, 777, E21.508, E23.069, E25.013, 257/E31.117; 348/340
See application file for complete search history.

(56) References Cited

U.S. PATENT DOCUMENTS 7,583,309 B2 * 9/2009 Aizawa et al. ................ 348/340

* cited by examiner

*Primary Examiner* — Thiem Phan
(74) *Attorney, Agent, or Firm* — Kirton McConkie; Evan R. Witt

(57) ABSTRACT

The present invention discloses a method for assembling a camera module. The method includes putting plural conductive bumps on a conductive contact of a substrate such that a large conductive bump is formed, and pressing the substrate and an image chip together such that the conductive contact contacts with a pad formed on the image chip through the large conductive bump to combine the conductive contact and the pad. Since there is no contact between the substrate and the image chip but the large conductive bump, the method decreases the probability for fracture between the substrate and the image chip and improves the quality of the camera module.

7 Claims, 15 Drawing Sheets

METHOD FOR ASSEMBLING CAMERA MODULE

FIELD OF THE INVENTION

The present invention generally relates to a method for assembling a camera module, and more particularly to an assembling method for applying to a camera module on a portable electronic device such as a cell phone or a personal digital assistant (PDA).

DESCRIPTION OF THE RELATED ART

A conventional camera module is assembled by a Flip-Chip package technology, and an assembling process thereof is described hereinafter first. Referring to FIG. 1, a flow chart of a conventional method for assembling a camera module is illustrated therein. A method for assembling the conventional camera module comprises a step S1: providing a ceramic substrate; a step 2: putting a conductive bump on an image chip; a step 3: pressing the ceramic substrate and the image chip together, so as to connect the conductive bump with a conductive contact; step 4: filling a sealing glue between the ceramic substrate and the image chip; and a step 5 finally: fixing a lens module on the ceramic substrate by an adhesive.

Each of the steps of the method for assembling the conventional camera module is illustrated above, and then referring to FIGS. 2A, 2B, 2C and 2D, schematic views of a conventional method for assembling a camera module are illustrated therein. According to the FIG. 2A, the ceramic substrate 11 has a conductive contact 111 and an aperture 112. The image chip 12 comprises a sensing region 121 and a pad 122, and a conductive bump 13 is disposed on the pad 122 as illustrated in the step S2. In general, the conductive bump 13 is made of aurum (Au). FIG. 2B illustrates the ceramic substrate 11 and the image chip 12 being pressed together, wherein the conductive bump 13 and the conductive contact 111 are connected with one another. FIG. 2C illustrates a sealing glue 14 being filled between the ceramic substrate 11 and the image chip 12. FIG. 2D illustrates a lens module 16 being fixed on the ceramic substrate 11 and thus a camera module 1 is formed.

Functions of components in the camera module 1 are described hereinafter in detail with FIG. 2D. The conductive contact 111 of the ceramic substrate 11 is electrically connected with the pad 122 of the image chip 12 via the conductive bump 13, and thus the camera module 1 is able to be conducted and activated. The sealing glue 14 is used for sealing the ceramic substrate 11 and the image chip 12 to avoid the camera module 1 being damaged by dust and mist. The camera module 16 comprises a lens 161 and a lens holder 162. The lens 161 is aligned to the aperture 112 and the sensing region 121, and thus light passing through the lens 161 and the aperture 112 is received by the sensing region 121 to generate an image when the camera module 1 is operated, wherein the lens module 16 is fixed on the ceramic substrate 11 by an adhesive.

The conventional camera module may be manufactured by the above-mentioned assembling process. However, the aperture 112 is formed by using a perforating element to punch the ceramic substrate 11 during a process for forming the aperture 112 of the ceramic substrate 11. A burr 113 is formed on an edge of the aperture 112 as illustrated in FIGS. 2A~2D after the perforating element perforates the ceramic substrate 11 and is pulled out of the aperture 112. Thus, where the burr 113 of the ceramic substrate 11 contacts the image chip 12 is formed as a pivot when the ceramic substrate 11 and the image chip 12 are pressed together. However, an extra force acting on the pivot (the burr 113) is likely to form a moment about the camera module 1 when the burr 113 is formed as the pivot. The moment may fracture a conjunction between the conductive bump 13 and the conductive contact 111, and thus the ceramic substrate 11 and the image chip 12 are likely to be separated from one another due to an instable connection therebetween. Besides, the substrate may have an uneven surface due to various factors during manufacturing process, such as manufacture tolerance. Where the uneven surface contacts the image chip 12 is also likely to form as a pivot, so as to fracture the conjunction between the conductive bump and the conductive contact. Thus, it is important to provide a camera module with more stable structure and thus with higher quality.

SUMMARY OF THE INVENTION

The present invention is directed to a method for assembling a camera module with more stable structure.

In a prefer embodiment, the present invention provides a method for assembling a camera module comprising the following steps. A first conductive bump is put on a conductive contact of a substrate. A second conductive bump is put on the first conductive bump to form a large conductive bump. The large conductive bump is flattened, and thus a top of the large conductive bump is pressed to form a top plane. The substrate and an image chip are pressed together to combine the large conductive bump and a pad on the image chip, and thus the conductive contact is electrically connected with the pad. Further, a sealing glue is filled between the substrate and the image chip.

According to a prefer embodiment, the method for assembling the camera module of the present invention further comprises a step of fixing a lens module on the substrate, wherein the lens module comprises a lens holder and a lens, and the lens is aligned to a sensing region of the image chip.

According to a prefer embodiment, the large conductive bump is flattened by a pressing head to form the top plane.

According to a prefer embodiment, the method for assembling the camera module of the present invention further comprises a step of putting a third conductive bump on the pad of the image chip before pressing the substrate and the image chip together.

According to a prefer embodiment, when the substrate and the image chip are pressed together, the third conductive bump is aligned to and contacts with the top plane, and thus the third conductive bump is electrically connected with the large conductive bump due to the conjunction therebetween, and accordingly the conductive contact is electrically connected with the pad.

According to a prefer embodiment, the substrate is a rigid-flex printed circuit board, a copper foil substrate (FR4 substrate) or a ceramic substrate.

According to a prefer embodiment, the rigid-flex printed circuit board comprises a first hard circuit board, a second hard circuit board and a soft circuit board disposed between the first hard circuit board and the second hard circuit board, and the conductive contact is disposed on the first hard circuit board.

In a prefer embodiment, the present invention further provides a method for assembling a camera module comprising the following steps. A first conductive bump and a second conductive bump are respectively put on a first conductive contact and a second conductive contact on a substrate. A third conductive bump is put on the first conductive bump to form a first large conductive bump, and a fourth conductive bump is put on the second conductive bump and a fifth conductive bump is put on the fourth conductive bump to form a second large conductive bump. The first large conductive bump and the second large conductive bump are flattened, and thus a first top of the first large conductive bump and a second top of the second large conductive bump are respectively pressed to form a first top plane and a second top plane. The substrate and an image chip are pressed together to combine the first large conductive bump and a first pad on the image chip and connect the second large conductive bump with a second pad on the image chip, and thus the first conductive contact is electrically connected with the first pad and the second conductive contact is electrically connected with the second pad. Further, a sealing glue is filled between the substrate and the image chip.

According to a prefer embodiment, the method for assembling the camera module of the present invention further comprises a step of fixing a lens module on the substrate, wherein the lens module comprises a lens holder and a lens, and the lens is aligned to a sensing region of the image chip.

According to a prefer embodiment, the first large conductive bump and the second large conductive bump are flattened by a pressing head to form the first top plane and the second top plane respectively.

According to a prefer embodiment, the method for assembling the camera module of the present invention further comprises a step of respectively putting a sixth conductive bump and a seventh conductive bump on the first pad and the second pad of the image chip before pressing the substrate and the image chip together.

According to a prefer embodiment, when the substrate and the image chip are pressed together, the sixth conductive bump is aligned to and contacts with the first top plane and the seventh conductive bump is aligned to and contacts with the second top plane, and thus the sixth conductive bump is electrically connected with the first large conductive bump due to the conjunction therebetween and the seventh conductive bump is electrically connected with the second large conductive bump due to the conjunction therebetween, and accordingly the first conductive contact is electrically connected with the first pad and the second conductive contact is electrically connected with the second pad.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
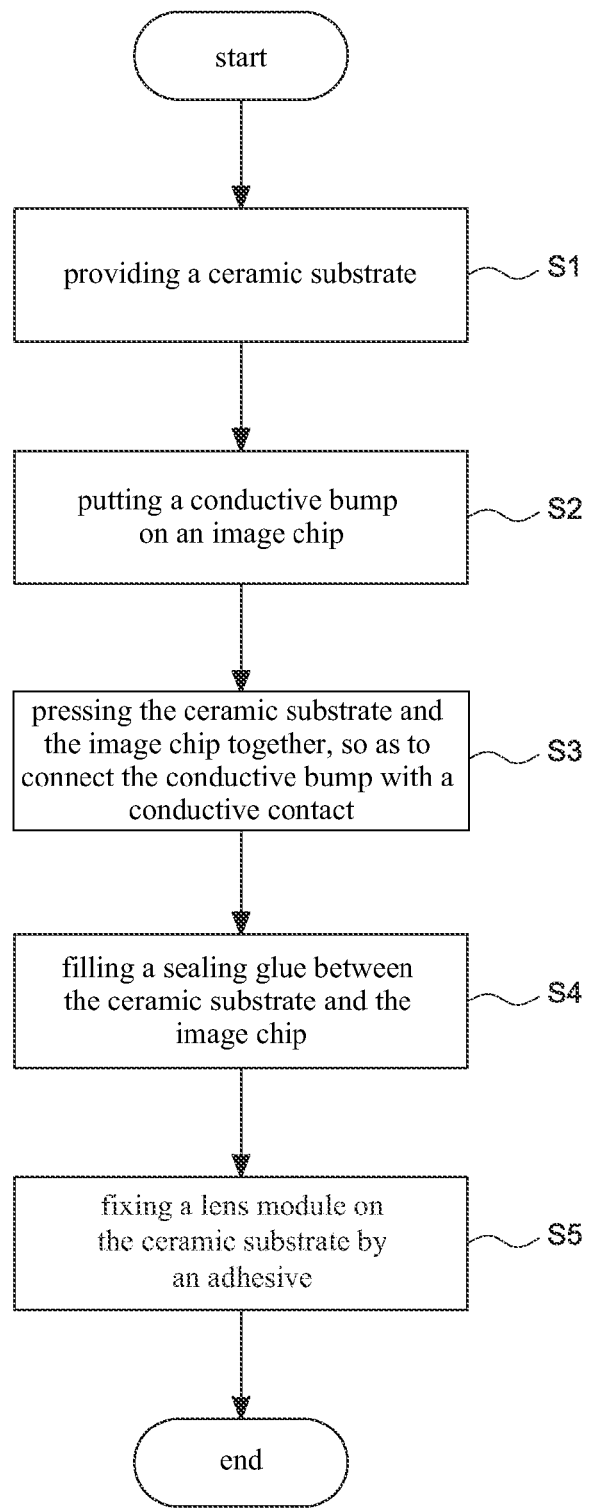
FIG. 1 illustrates a flow chart of a conventional method for assembling a camera module.
Figure 2A:
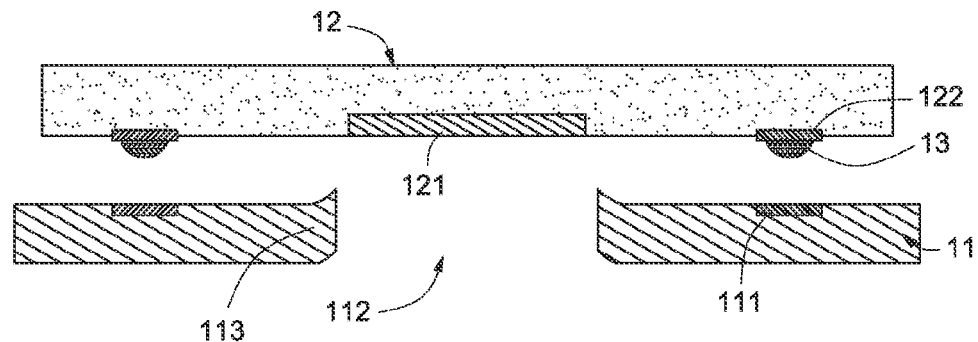
FIGS. 2A, 2B, 2C and 2D illustrate schematic views of a conventional method for assembling a camera module.
Figure 2B:
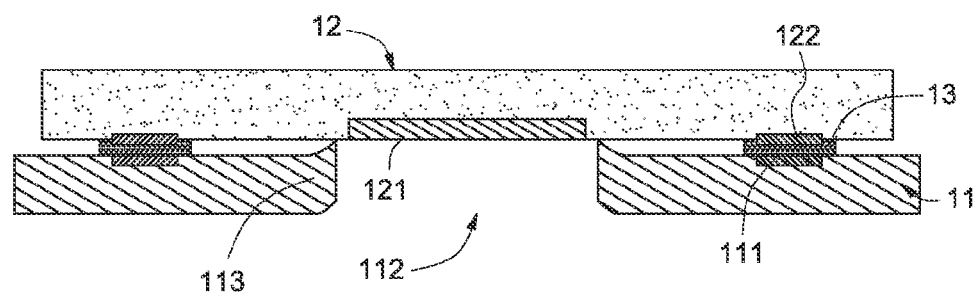
Figure 2C:
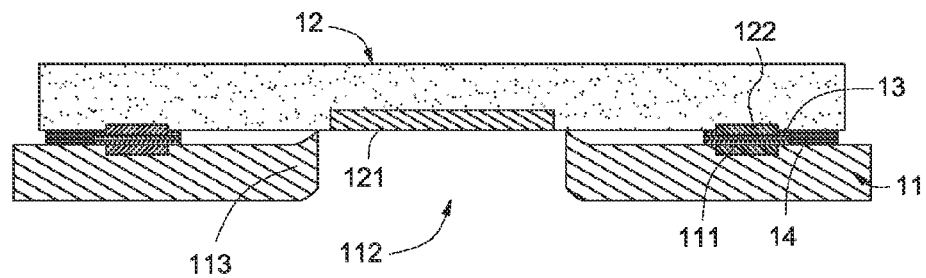
Figure 2D:
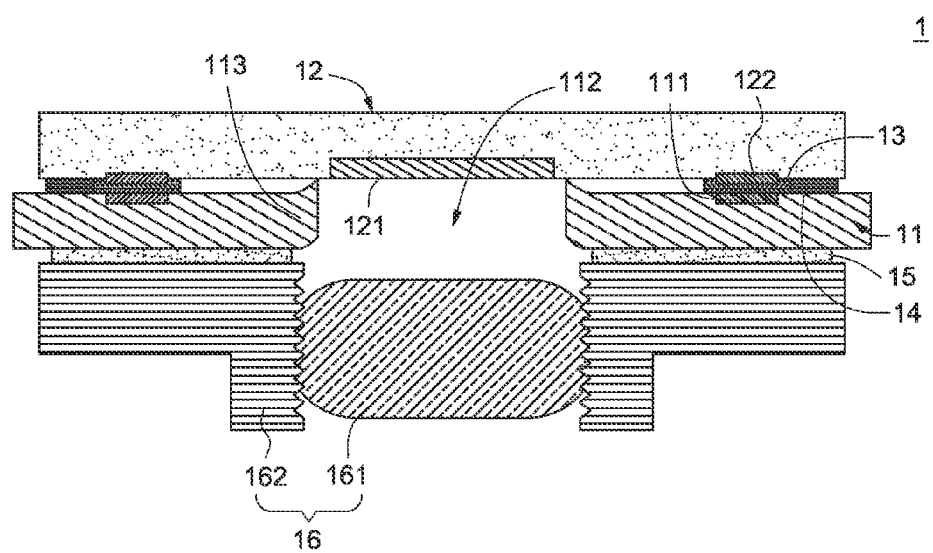
Figure 3:
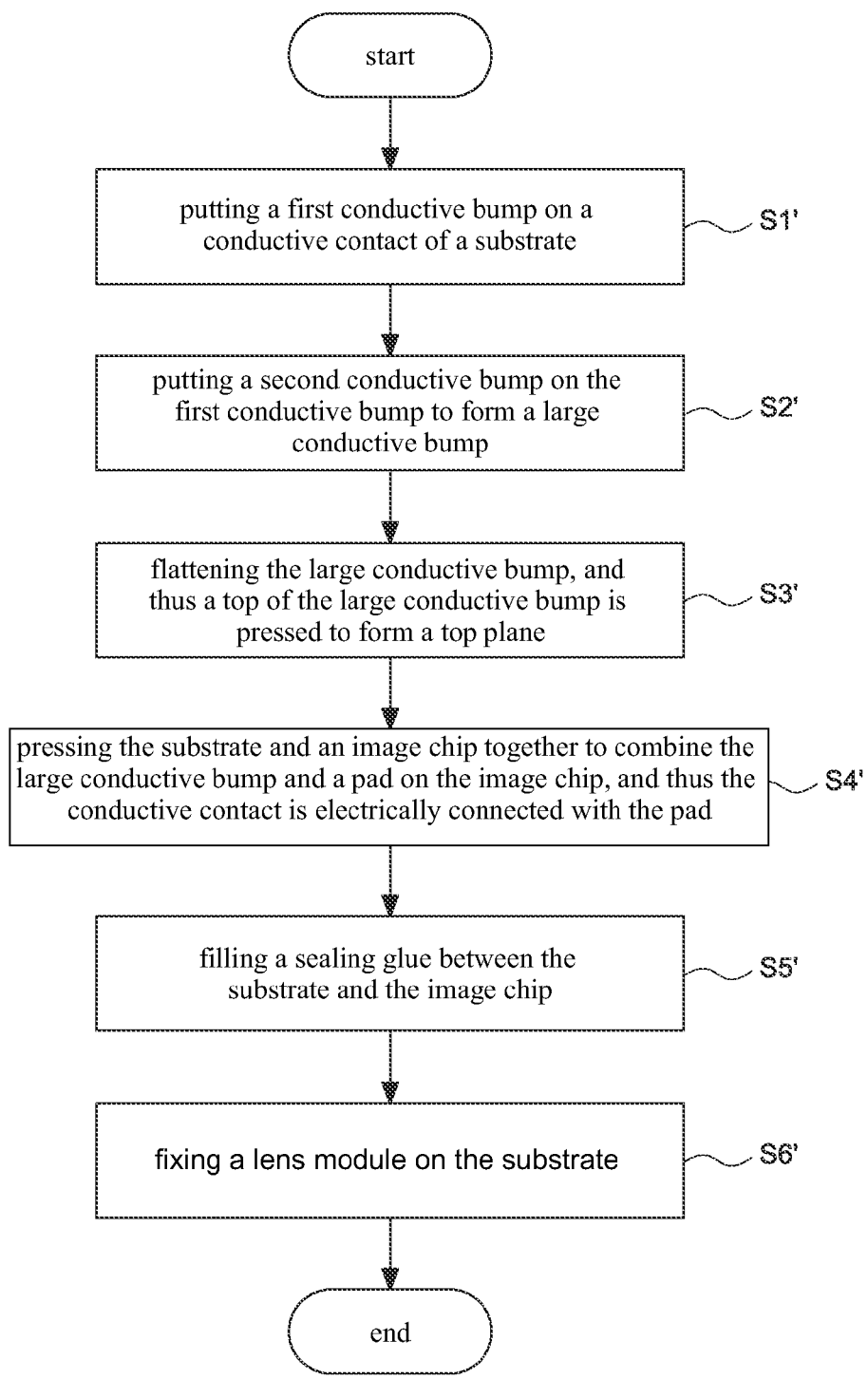
FIG. 3 illustrates a flow chart of a method for assembling a camera module according to a first prefer embodiment of the present invention.

In view of the defects of the conventional method for assembling a camera module, the present invention provides a method for assembling a camera module with more stable structure. Referring to FIG. 3, a flow chart of a method for assembling a camera module according to a first prefer embodiment of the present invention is illustrated therein. The method for assembling a camera module of the present invention comprises the following steps. A step S1' is putting a first conductive bump on a conductive contact of a substrate. A step S2' is putting a second conductive bump on the first conductive bump to form a large conductive bump. A step S3' is flattening the large conductive bump, and thus a top of the large conductive bump is pressed to form a top plane. A step S4' is pressing the substrate and an image chip together to combine the large conductive bump and a pad on the image chip, and thus the conductive contact is electrically connected with the pad. A step S5' is filling a sealing glue between the substrate and the image chip. Further, a step S6' is fixing a lens module on the substrate.

Figure 4A:
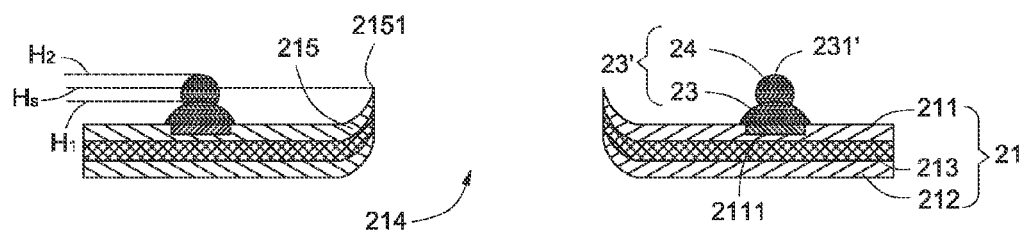
FIGS. 4A, 4B, 4C, 4D, 4E and 4F illustrate schematic views of a method for assembling a camera module according to a first prefer embodiment of the present invention.

Referring to FIGS. 4A, 4B, 4C, 4D, 4E and 4F hereinafter, schematic views of a method for assembling a camera module according to a first prefer embodiment of the present invention is illustrated therein. The substrate may use a rigid-flex printed circuit board, a copper foil substrate or a ceramic substrate. In the present prefer embodiment, the substrate is illustrated as a rigid-flex printed circuit board 21. In FIG. 4A, the rigid-flex printed circuit board 21 (i.e. substrate) comprises a first hard circuit board 211, a second hard circuit board 212 and a soft circuit board 213 disposed between the first hard circuit board 211 and the second hard circuit board 212, and the first hard circuit board 211 has a conductive contact 2111. The rigid-flex printed circuit board 21 has an aperture 214 and a burr 215 formed by a process for forming the aperture 214, wherein the aperture 214 passes through the first hard circuit board 211, the second hard circuit board 212 and the soft circuit board 213, and is located at a center of the rigid-flex printed circuit board 21. The burr 215 has a highest surface 2151, and a height of the highest surface 2151 is presented as a surface height Hs. A first conductive bump 23 is put on a conductive contact 2111 of the rigid-flex printed circuit board 21 (i.e. the step S1'), and a height of the first conductive bump 23 is presented as a first height H1, and the first height H1 is lower than the surface height Hs, wherein the surface height Hs and the first height H1 are defined by measuring from a bottom of the rigid-flex printed circuit board 21.

Next, a second conductive bump 24 is put on the first conductive bump 23 to form a large conductive bump 23' (i.e. the step S2'). The large conductive bump 23' has a top 231', and a height of the top 231' of the large conductive bump 23' is presented as a second height H2, wherein the second height H2 is higher than the surface height Hs. As illustrated in FIG. 4A, the first height H1 is lower than the surface height Hs, and thus the method of the present invention further puts the second conductive bump 24 on the first conductive bump 23, so as to let the conductive bumps put on the conductive contact 2111 become higher than the surface height Hs. In the prefer embodiment, the first conductive bump 23 and the second conductive bump 24 are made of aurum. It should be noted that structures, shapes and heights of the rigid-flex printed circuit board 21 and the large conductive bump 23' located at a left side of the aperture 214 are all the same as structures, shapes and heights of the rigid-flex printed circuit board 21 and the large conductive bump 23' located at a right side of the aperture 214. For simplifying the drawing, the height symbols are only marked on the rigid-flex printed circuit board 21 and the large conductive bump 23' at the left side of the FIG. 4A, and the element symbols are only marked on the rigid-flex printed circuit board 21 and the large conductive bump 23' at the right side of the FIG. 4A, so as to showing the symbols clearly instead of too complicate drawing.

Figure 4B:
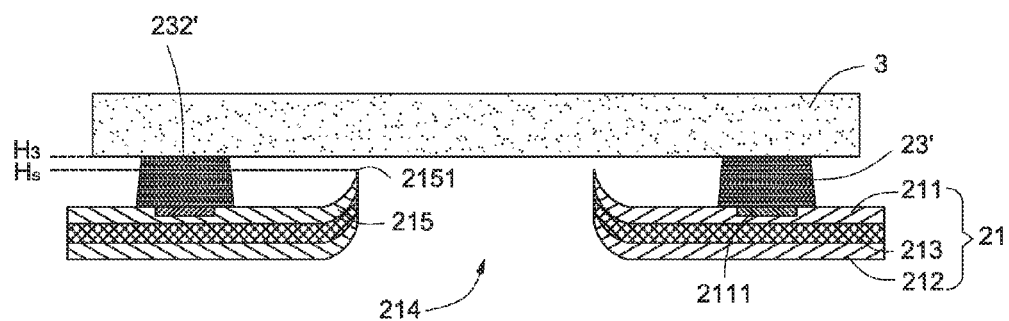

In FIG. 4B, the large conductive bump 23' is flattened by a pressing head 3, so as to press the top 231' of the large conductive bump 23' to form a top plane 232' (i.e. the step S2'), and a height of the top plane 232' is presented as a third height H3. The third height H3 is lower than the second height H2 but still higher than the surface height Hs, wherein the second height H2 and the third height H3 are also defined by measuring from the bottom of the rigid-flex printed circuit board 21. Comparing FIG. 4A with FIG. 4B, a contact area of the top 231' is quite small due to the top 231' is a spherical surface, but the top plane 232' formed by flattening is a plane, and thus a contact area of the top plane 232' is larger than that of the top 231'.

Figure 4C:
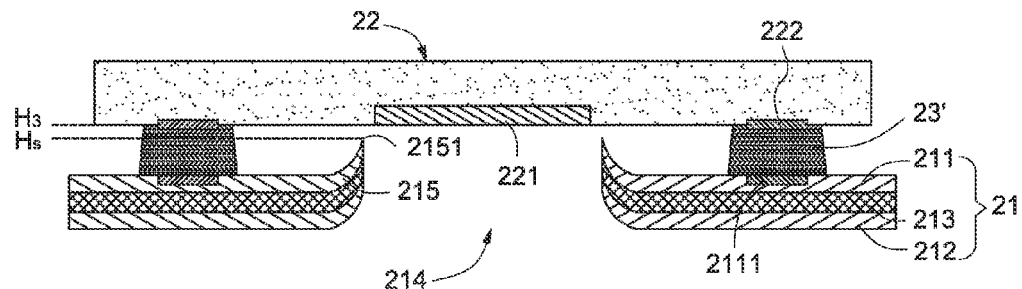
Figure 4D:
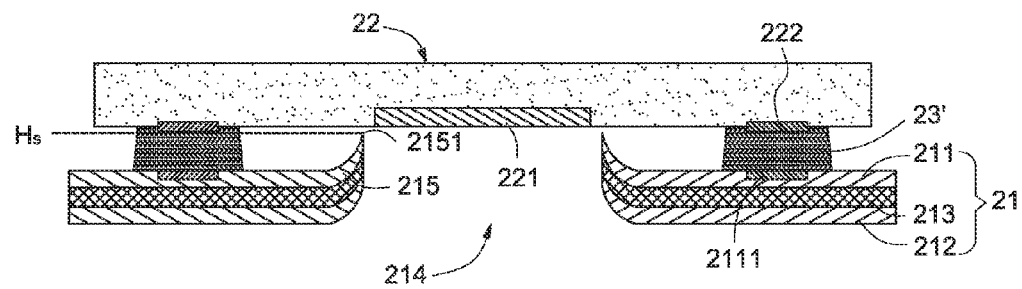
Figure 4E:
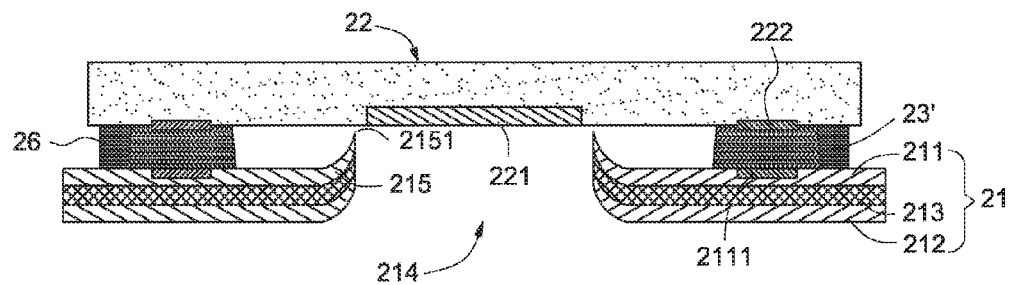
Figure 4F:
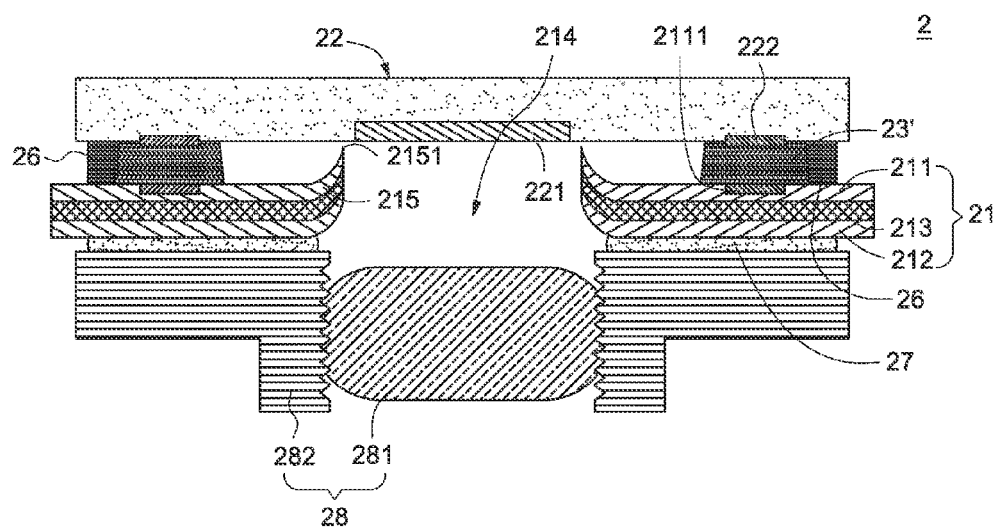

In FIG. 4C, an image chip 22 comprises a sensing region 221 and a pad 222, and the pad 222 of the image chip 22 is aligned to the top plane 232' of the large conductive bump 23'. Next, the rigid-flex printed circuit board 21 and the image chip 22 are pressed together to combine the large conductive bump 23' and the pad 222 on the image chip 22, and thus the conductive contact 2111 is electrically connected with the pad 222 as illustrated in FIG. 4D (i.e. the step S4'). In FIG. 4E, a sealing glue 26 is filled for avoiding dust and mist entering into where between the rigid-flex printed circuit board 21 and the image chip 22 (i.e. the step S5'). In FIG. 4F, a lens module 28 is fixed on the second hard circuit board 212 to form a camera module 2 (i.e. the step S6'), wherein the lens module 28 comprises a lens holder 282 and a lens 281, and the lens 281 is aligned to the sensing region 221 of the image chip 22. In the prefer embodiment, the lens module 28 is fixed on the second hard circuit board 212 by an adhesive 27. Structures and functions of each component of the camera module 2 are all the same as the conventional one and are omitted herein. It should be noted that the prefer embodiment illustrating the substrate as the rigid-flex printed circuit board 21 is for example only, the present invention may also be practiced by using a copper foil substrate or a ceramic substrate as the substrate without varying the assembling process.

The method for assembling the camera module of the present invention is described above in detail. The characteristic of the present invention is disposing at least an additional conductive bump on the original conductive bump to ensure the total height of all conductive bumps is higher than the surface height of the highest surface whether the original conductive bump on the conductive contact is higher than the surface height or not. Accordingly, there is no pivot formed by the burr of the substrate contacting the image chip, and thus a moment about the camera module formed by an extra force acting on the pivot in the related art is not likely to form, so as to avoid fracturing the conjunction between the conductive bump and the conductive contact.

Figure 5:
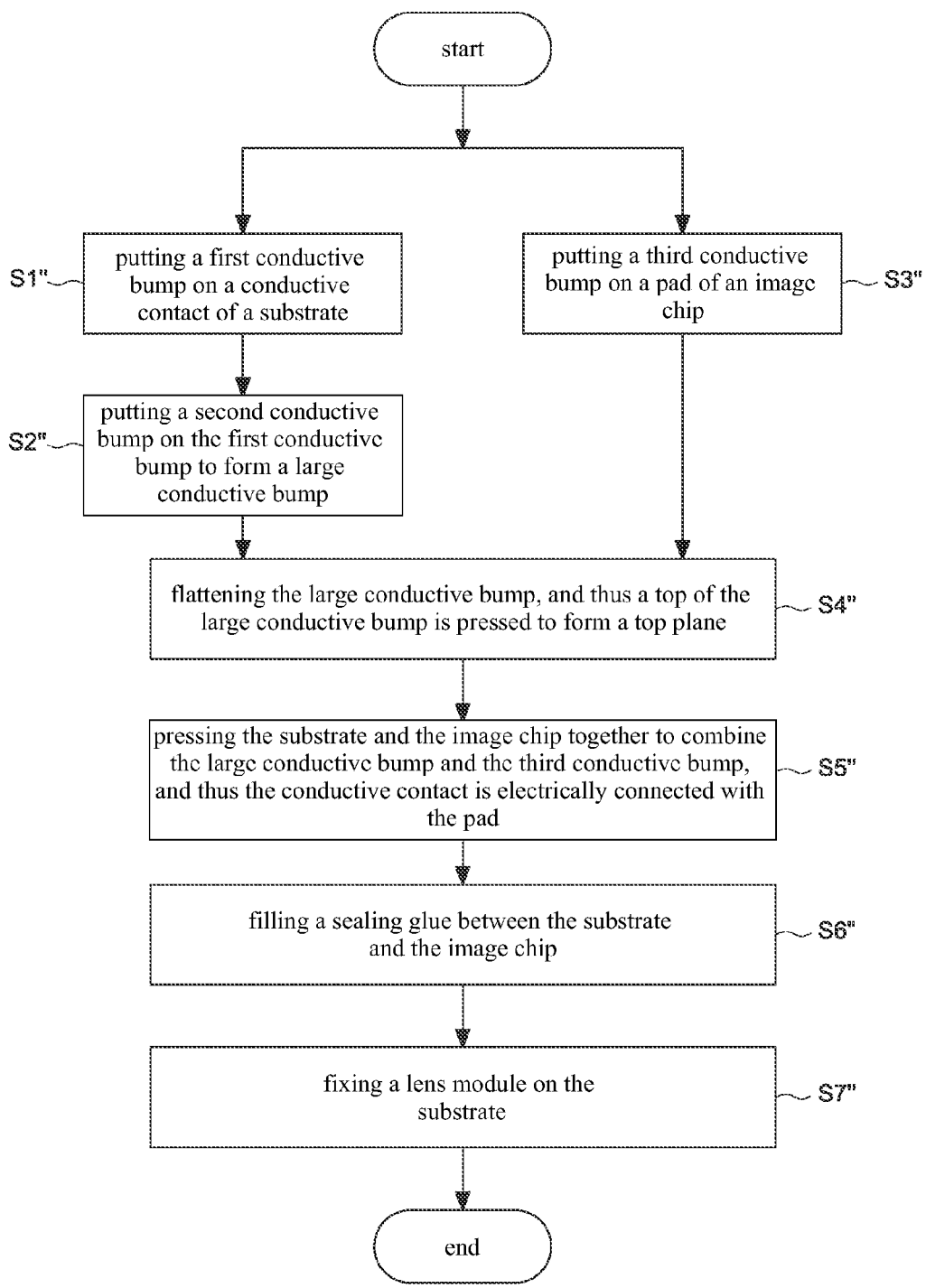
FIG. 5 illustrates a flow chart of a method for assembling a camera module according to a second prefer embodiment of the present invention.

In addition, the present invention further provides a second prefer embodiment as illustrated in FIG. 5, a flow chart of a method for assembling a camera module according to a second prefer embodiment of the present invention is illustrated therein. The method for assembling a camera module of the present invention comprises the following steps. A step S1" is putting a first conductive bump on a conductive contact of a substrate. A step S2" is putting a second conductive bump on the first conductive bump to form a large conductive bump. A step S3" is putting a third conductive bump on a pad of an image chip. A step S4" is flattening the large conductive bump, and thus a top of the large conductive bump is pressed to form a top plane. A step S5" is pressing the substrate and the image chip together to combine the large conductive bump and the third conductive bump, and thus the conductive contact is electrically connected with the pad. A step S6" is filling a sealing glue between the substrate and the image chip. Further, a step S7" is fixing a lens module on the substrate.

Figure 6A:
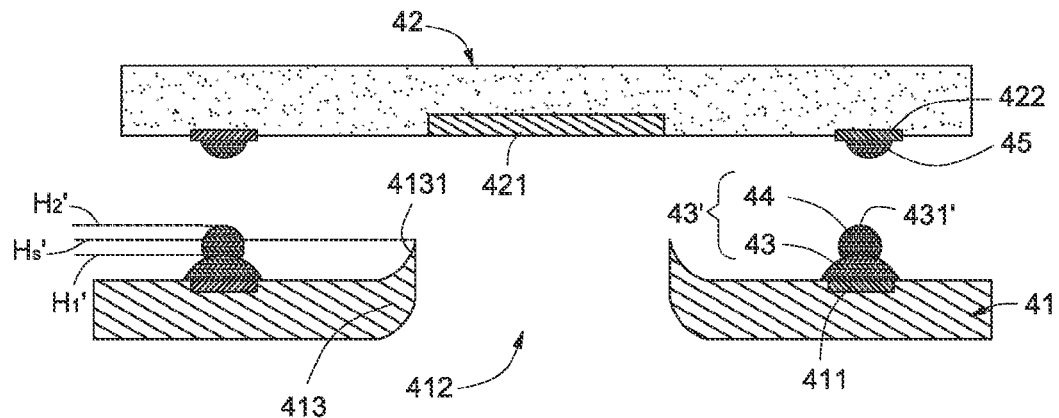
FIGS. 6A, 6B, 6C, 6D, 6E and 6F illustrate schematic views of a method for assembling a camera module according to a second prefer embodiment of the present invention.

Referring to FIGS. 6A, 6B, 6C, 6D, 6E and 6F hereinafter, schematic views of a method for assembling a camera module according to a second prefer embodiment of the present invention is illustrated therein. In the prefer embodiment, the substrate is illustrated as a ceramic substrate 41. In FIG. 6A, the ceramic substrate 41 (i.e. substrate) comprises a conductive contact 411, an aperture 412 and a burr 413. The aperture 412 passes through the ceramic substrate 41 and is located at a center of the ceramic substrate 41. The burr 413 has a highest surface 4131, and a height of the highest surface 4131 is presented as a surface height Hs'. In addition, an image chip 42 comprises a sensing region 421 and a pad 422. A first conductive bump 43 is put on a conductive contact 411 of the ceramic substrate 41 (i.e. the step S1"), and a third conductive bump 45 is put on the pad 422 of the image chip 42 (i.e. the step S3"). A height of the first conductive bump 43 is presented as a first height H1', and the first height H1' is lower than the surface height Hs', wherein the surface height Hs' and the first height H1' are defined by measuring from a bottom of the ceramic substrate 41.

Next, a second conductive bump 44 is put on the first conductive bump 43 to form a large conductive bump 43' (i.e. the step S2"). The large conductive bump 43' has a top 431', and a height of the top 431' of the large conductive bump 43' is presented as a second height H2', wherein the second height H2' is higher than the surface height Hs'. As illustrated in FIG. 6A, the first height H1' is lower than the surface height Hs', and thus the method of the present invention further puts the second conductive bump 44 on the first conductive bump 43, so as to let the conductive bumps put on the conductive contact 411 become higher than the surface height Hs'. In the prefer embodiment, the first conductive bump 43, the second conductive bump 44 and the third conductive bump 45 are made of aurum. It should be noted that the present prefer embodiment is similar to the first prefer embodiment, i.e. structures, shapes and heights of the ceramic substrate 41 and the large conductive bump 43' located at two sides of the aperture 412 are all the same. Therefore, for simplifying the drawing, the height symbols are only marked on the ceramic substrate 41 and the large conductive bump 43' at the left side of the FIG. 6A, and the element symbols are only marked on the ceramic substrate 41 and the large conductive bump 43' at the right side of the FIG. 6A, so as to showing the symbols clearly instead of too complicate drawing.

Figure 6B:
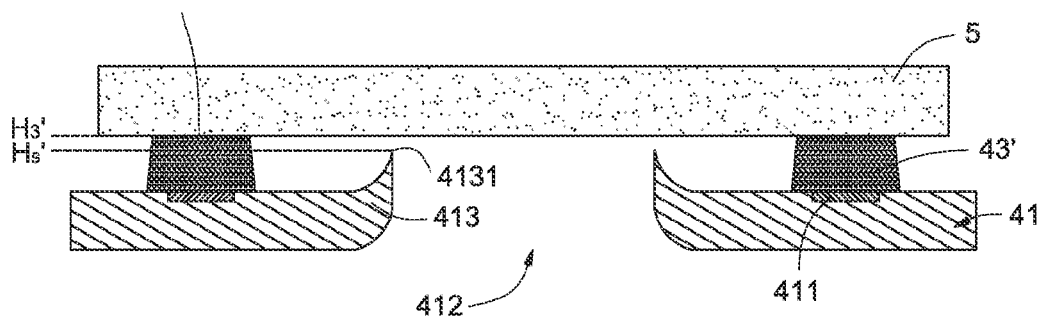

In FIG. 6B, the large conductive bump 43' is flattened by a pressing head 5, so as to press the top 431' of the large conductive bump 43' to form a top plane 432' (i.e. the step S4"), and a height of the top plane 432' is presented as a third height H3'. The third height H3' is lower than the second height H2' but still higher than the surface height Hs', wherein the second height H2' and the third height H3' are also defined by measuring from the bottom of the ceramic substrate 41. In the step S3", the top 431' of the large conductive bump 43' is transformed from a spherical surface into the top plane 432', so as to let the large conductive bump 43' have a larger contact area.

Figure 6C:
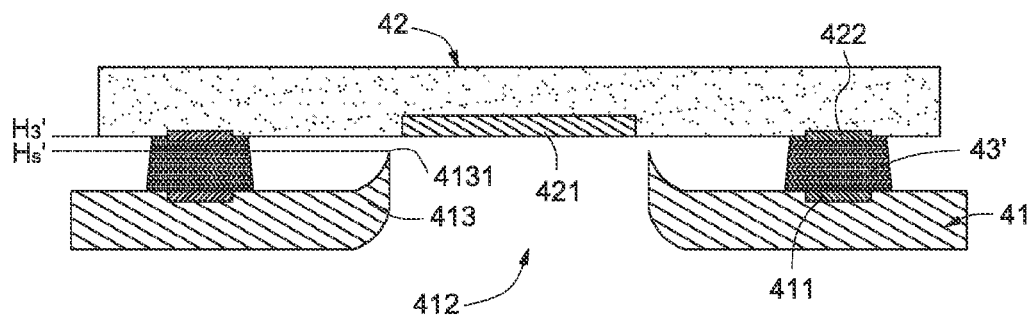
Figure 6D:
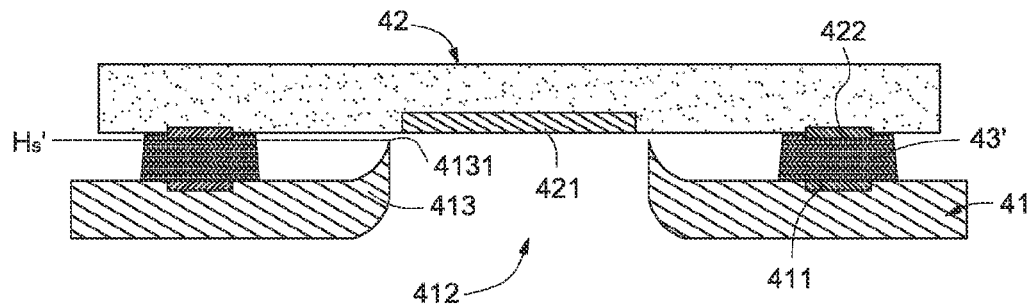
Figure 6E:
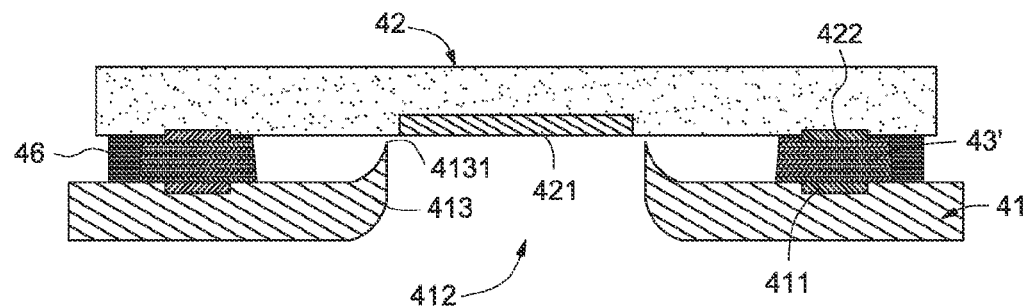
Figure 6F:
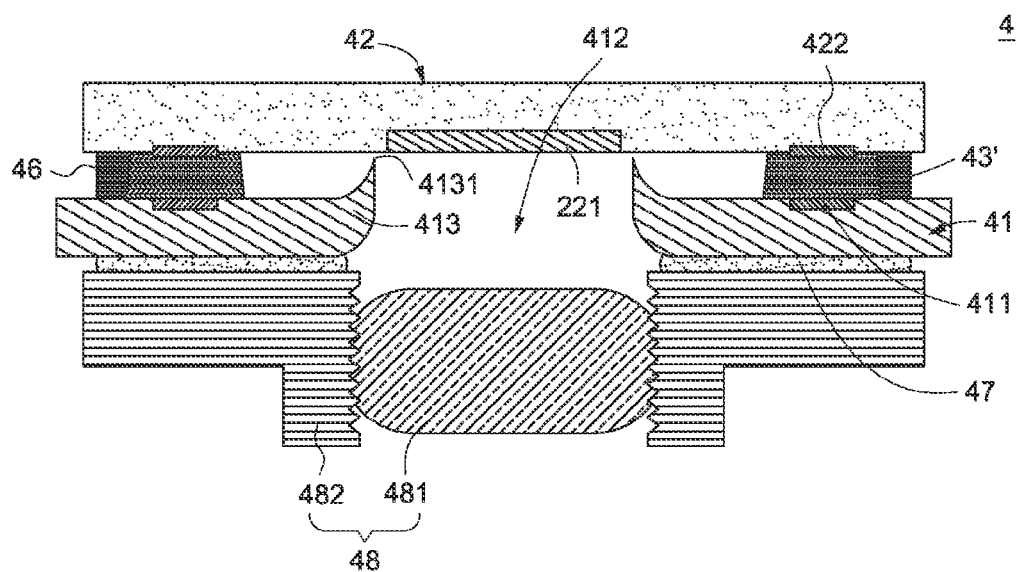

In FIG. 6C, the pad 422 of the image chip 42 is aligned to the top plane 432' of the large conductive bump 43'. Thereafter, the ceramic substrate 41 and the image chip 42 are pressed together to combine the large conductive bump 43' and the third conductive bump 45, and thus the conductive contact 411 is electrically connected with the pad 422 as illustrated in FIG. 6D (i.e. the step S5"). In FIG. 6E, a sealing glue 46 is filled for avoiding dust and mist entering into where between the ceramic substrate 41 and the image chip 42 (i.e. the step S6"). In FIG. 6F, a lens module 48 is fixed on the ceramic substrate 41 to form a camera module 4 (i.e. the step S7"), wherein the lens module 48 comprises a lens holder 482 and a lens 481, and the lens 481 is aligned to the sensing region 421 of the image chip 42. In the prefer embodiment, the lens module 48 is fixed on the ceramic substrate 41 by an adhesive 27. Structures and functions of each component of the camera module 4 are all the same as the conventional one and are omitted herein.

The method for assembling the camera module of the present invention is described above in detail. In the prefer embodiment, another additional conductive bump is disposed on the image chip. Therefore, a conjunction between the conductive contact and the pad is reinforced due to combining the large conductive bump and the additional conductive bump when the ceramic substrate and the image chip are pressed together, and thus a conjunction between the ceramic substrate and the image chip becomes more stable. It should be noted that for one, the prefer embodiment illustrating the substrate as the ceramic substrate 41 is for example only, the present invention may also be practiced by using a copper foil substrate or a rigid-flex printed circuit board as the substrate without varying the assembling process. For two, the method for assembling the camera module of the present invention does not limit to process the steps S1", S2" and S3" in sequence or simultaneously, i.e. the steps S1" and S3" may be processed simultaneously, the step S1" may be processed before the step S3", or the step S1" may be processed after the step S3". Also, the steps S2" and S3" may be processed simultaneously, the step S2" may be processed before the step S3", or the step S2" may be processed after the step S3".

Figure 7:
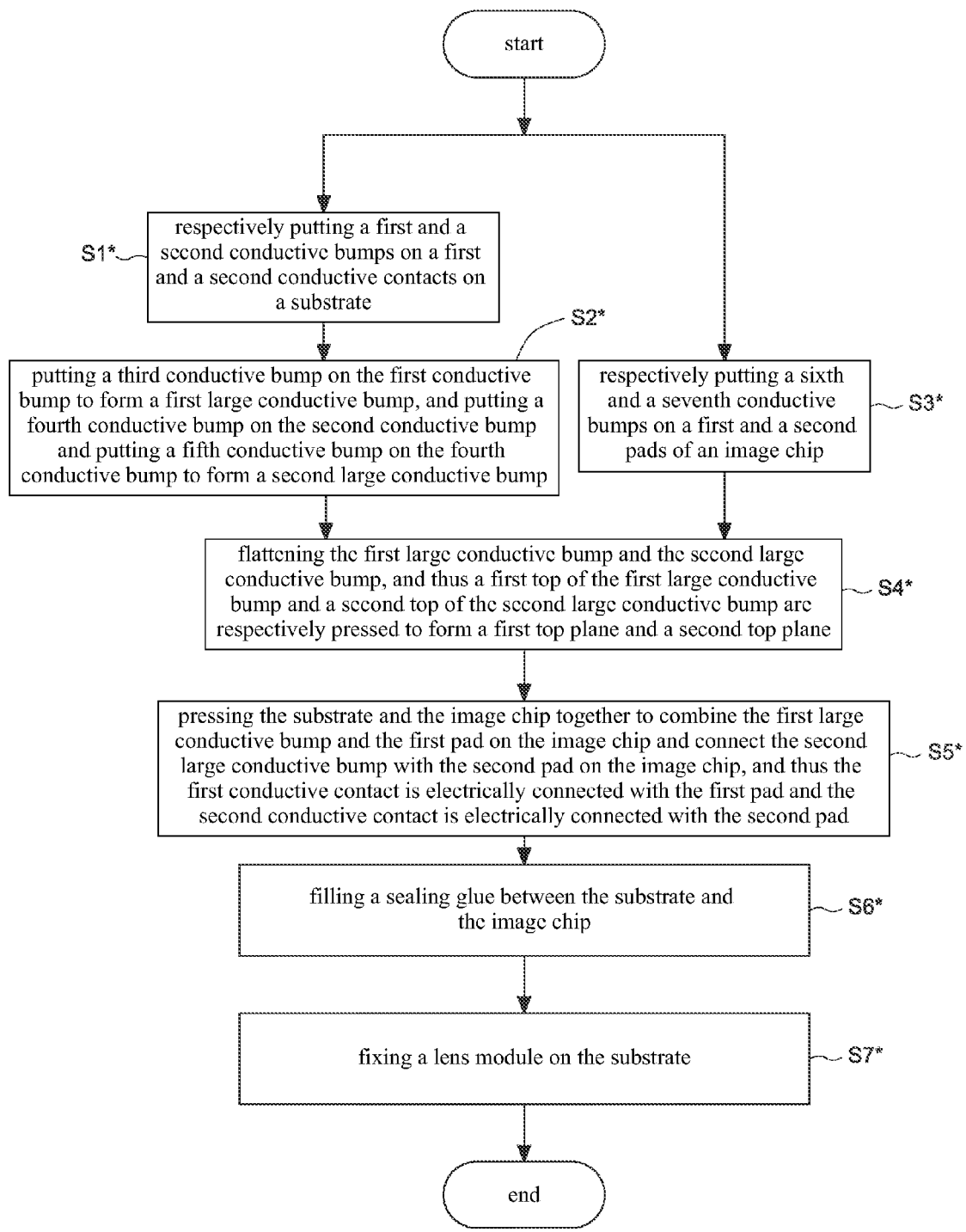
FIG. 7 illustrates a flow chart of a method for assembling a camera module according to a third prefer embodiment of the present invention.

Besides, the present invention further provides a third prefer embodiment as illustrated in FIG. 7, a flow chart of a method for assembling a camera module according to a third prefer embodiment of the present invention is illustrated therein. The method for assembling a camera module of the present invention comprises the following steps. A step S1* is respectively putting a first conductive bump and a second conductive bump on a first conductive contact and a second conductive contact on a substrate. A step S2* is putting a third conductive bump on the first conductive bump to form a first large conductive bump, and putting a fourth conductive bump on the second conductive bump and putting a fifth conductive bump on the fourth conductive bump to form a second large conductive bump. A step S3* is respectively putting a sixth conductive bump and a seventh conductive bump on a first pad and a second pad of an image chip. A step S4* is flattening the first large conductive bump and the second large conductive bump, and thus a first top of the first large conductive bump and a second top of the second large conductive bump are respectively pressed to form a first top plane and a second top plane. A step S5* is pressing the substrate and the image chip together to combine the first large conductive bump and the first pad on the image chip and connect the second large conductive bump with the second pad on the image chip, and thus the first conductive contact is electrically connected with the first pad and the second conductive contact is electrically connected with the second pad. A step S6* is filling a sealing glue between the substrate and the image chip. Further, a step S7* is fixing a lens module on the substrate.

Figure 8A:
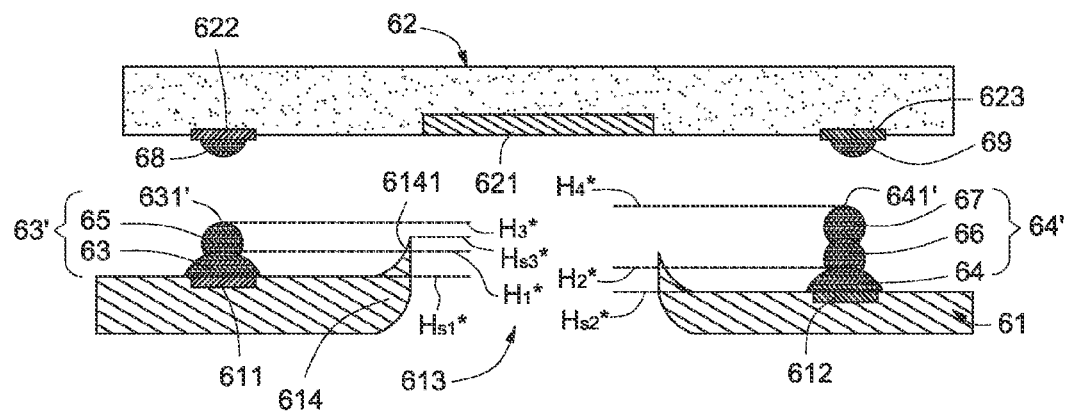
FIGS. 8A, 8B, 8C, 8D, 8E and 8F illustrate schematic views of a method for assembling a camera module according to a third prefer embodiment of the present invention.

Referring to FIGS. 8A, 8B, 8C, 8D, 8E and 8F hereinafter, schematic views of a method for assembling a camera module according to a third prefer embodiment of the present invention is illustrated therein. In the prefer embodiment, the substrate is illustrated as a copper foil substrate 61. In FIG. 8A, the copper foil substrate 61 (i.e. substrate) comprises a first conductive contact 611, a second conductive contact 612, an aperture 613 and a burr 614. A height of the first conductive contact 611 is presented as a first surface height Hs1*. A height of the second conductive contact 612 is presented as a second surface height Hs2*. The aperture 613 passes through the copper foil substrate 61 and is located at a center of the copper foil substrate 61. The burr 614 has a highest surface 6141, and a height of the highest surface 6141 is presented as a third surface height Hs3*. Since the first surface height Hs1* is higher than the second surface height Hs2*, the surface of the copper foil substrate 61 is uneven. In addition, an image chip 62 comprises a sensing region 621, a first pad 622 and a second pad 623. A first conductive bump 63 and a second conductive bump 64 are respectively put on the first conductive contact 611 and the second conductive contact 612 of the copper foil substrate 61 (i.e. the step S1*), wherein a height of the first conductive bump 63 is presented as a first height H1*, and a height of the second conductive bump 64 is presented as a second height H2*. As illustrated in FIG. 8A, the second height H2* is lower than the first height H1*, and the first height H1* is lower than the third surface height Hs3*.

Next, a third conductive bump 65 is put on the first conductive bump 63 to form a first large conductive bump 63', and a fourth conductive bump 66 is put on the second conductive bump 64 and a fifth conductive bump 67 is put on the fourth conductive bump 66 to form a second large conductive bump 64' (i.e. the step S2*). As illustrated in FIG. 8A, a height of a first top 631' of the first large conductive bump 63' is presented as a third height H3*, and a height of a second top 641' of the second large conductive bump 64' is presented as a fourth height H4*, wherein the fourth height H4* is higher than the third height H3*, and the third height H3* is higher than the third surface height Hs3*, i.e. the first large conductive bump 63' and the second large conductive bump 64' are both higher than the highest surface 6141 of the burr 614. Further, a sixth conductive bump 68 and a seventh conductive bump 69 are respectively put on the first pad 622 and the second pad 623 of the image chip 62 (i.e. the step S3*). In the prefer embodiment, the first conductive bump 63, the second conductive bump 64, the third conductive bump 65, the fourth conductive bump 66, the fifth conductive bump 67, the sixth conductive bump 68 and the seventh conductive bump 69 are all made of aurum.

Figure 8B:
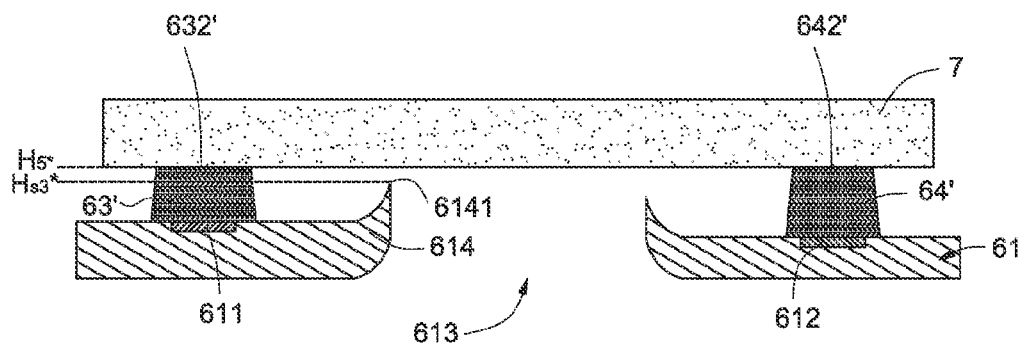

In FIG. 8B, the first large conductive bump 63' and the second large conductive bump 64' are flattened by a pressing head 7, so as to press the first top 631' of the first large conductive bump 63' to form a first top plane 632', and press the second top 641' of the second large conductive bump 64' to form a second top plane 642' (i.e. the step S4*), wherein heights of the first top plane 632' and the second top plane 642' are equal to one another and both presented as a fifth height H5*. The fifth height H5* is lower than the third height H3* but still higher than the third surface height Hs3*. As illustrated in FIG. 8A and FIG. 8B, the first height H1*, the second height H2*, the third height H3*, the fourth height H4*, the fifth height H5*, the first surface height Hs1*, the second surface height Hs2* and the third surface height are all defined by measuring from a bottom of the copper foil substrate 61.

Figure 8C:
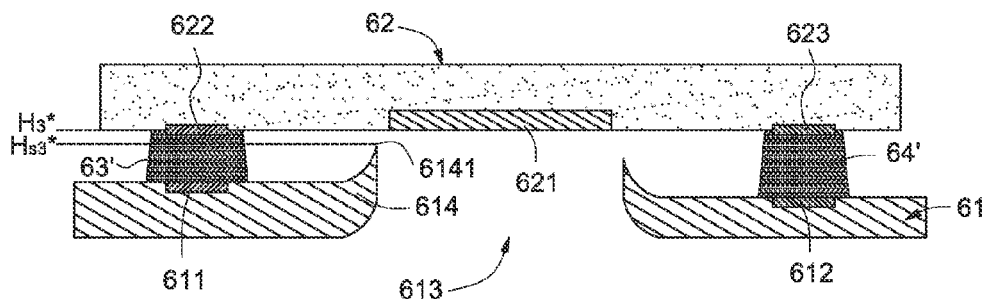
Figure 8D:
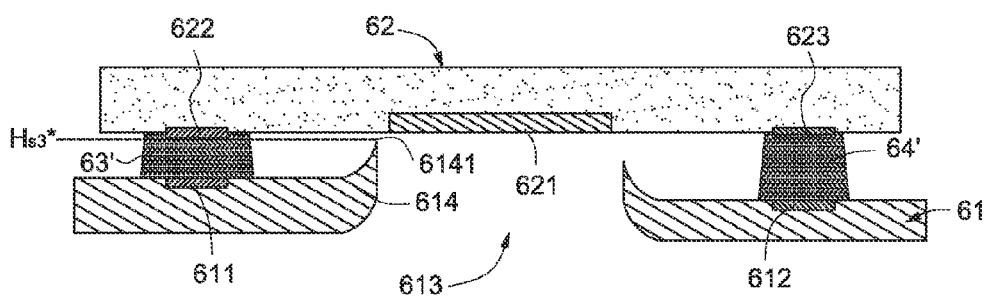
Figure 8E:
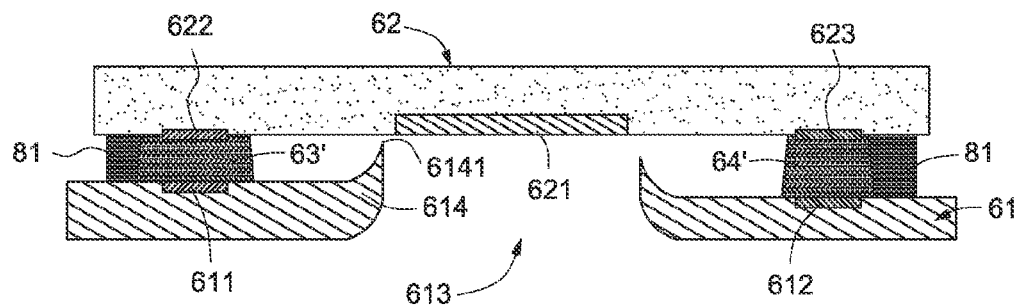
Figure 8F:
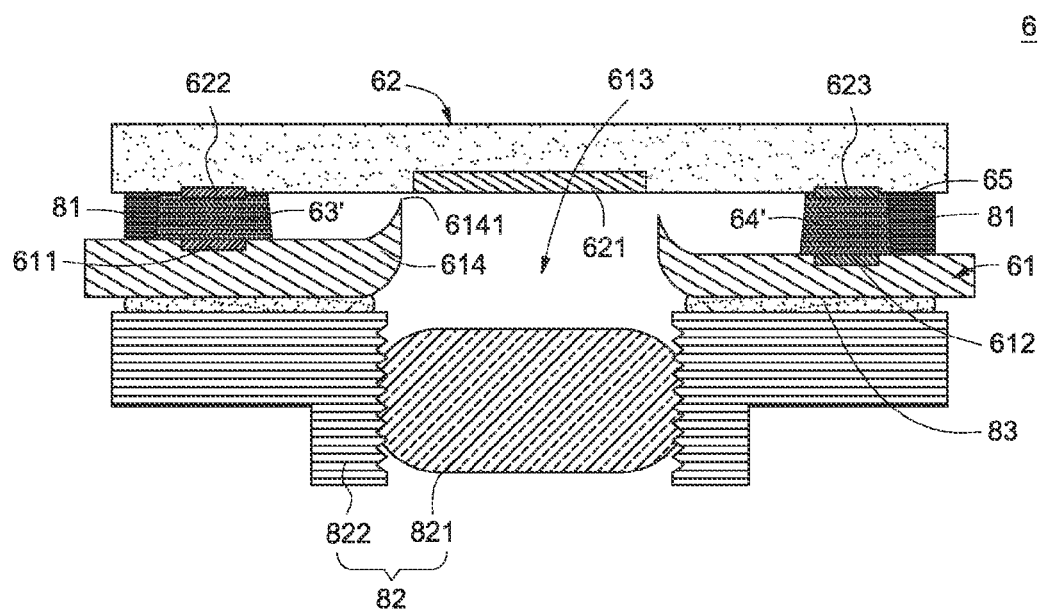

In FIG. 8C, the sixth conductive bump 68 and the seventh conductive bump 69 on the image chip 62 are respectively aligned to the first top plane 632' of the first large conductive bump 63' and the second top plane 642' of the second large conductive bump 64'. Next, the copper foil substrate 61 and the image chip 62 are pressed together to respectively combine the first large conductive bump 63' with the sixth conductive bump 68 and the second large conductive bump 64' with the seventh conductive bump 69, and thus the first conductive contact 611 and the second conductive contact 612 are respectively electrically connected with the first pad 622 and the second pad 623 as illustrated in FIG. 8D (i.e. the step S5*). In FIG. 8E, a sealing glue 81 is filled for avoiding dust and mist entering into where between the copper foil substrate 61 and the image chip 62 (i.e. the step S6*). In FIG. 8F, a lens module 82 is fixed on the copper foil substrate 61 to form a camera module 6 (i.e. the step S7*), wherein the lens module 82 comprises a lens holder 822 and a lens 821, and the lens 821 is aligned to the sensing region 621 of the image chip 62. In the prefer embodiment, the lens module 82 is fixed on the copper foil substrate 61 by an adhesive 83. Structures and functions of each component of the camera module 6 are all the same as the conventional one and are omitted herein.

It should be noted that for one, the prefer embodiment illustrating the substrate as the copper foil substrate 61 is for example only, the present invention may also be practiced by using a ceramic substrate or a rigid-flex printed circuit board as the substrate without varying the assembling process. For two, the method for assembling the camera module of the present invention does not limit to process the steps S1*, S2* and S3* in sequence or simultaneously, i.e. the steps S1* and S3* may be processed simultaneously, the step S1* may be processed before the step S3*, or the step S1* may be processed after the step S3*. Also, the steps S2* and S3* may be processed simultaneously, the step S2* may be processed before the step S3*, or the step S2* may be processed after the step S3*.

According to the above-mentioned prefer embodiments, the characteristic of the present invention is contacting the conductive contact with the pad as better as possible when the substrate is combined with the image chip, so as to avoid other contact forming between the substrate and the image chip beside the contact of the conductive contact and the pad. Since the substrate is unavoidable to have an uneven surface, besides the original conductive bump put on the conductive contact, the present invention may further dispose at least an additional conductive bump on the original conductive bump to ensure the total height of all conductive bumps on the conductive contact is higher than the highest surface of the substrate, and thus the stability of the camera module is enhanced due to the possibility of the substrate contacting the image chip with any other portion besides the conductive contact is reduced. According to the reliability test, the camera module assembled by the method of the present invention certainly has a stronger structure than that assembled by the conventional method. Moreover, the present invention further comprises a step of flattening the large conductive bump to form the top plane on the conductive bump. Therefore, the alignment between the image chip and the substrate is easier due to the contact surface of the large conductive bump is enlarged, so as to avoid mismatching the image chip and the substrate.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for assembling a camera module comprising:
   putting a first conductive bump on a conductive contact of a substrate, wherein the substrate has an aperture formed therein and a burr, wherein the burr has a highest surface corresponding to a surface height;
   putting a second conductive bump on the first conductive bump to form a large conductive bump, wherein the large conductive bump has a top, wherein the top has a height above the substrate greater than the surface height of the burr;
   flattening the large conductive bump, and thus a top of the large conductive bump is pressed to form a top plane;
   pressing the substrate and an image chip together to combine the large conductive bump and a pad on the image chip, and thus the conductive contact is electrically connected with the pad; and
   filling a sealing glue between the substrate and the image chip.

2. The method for assembling the camera module as claimed in claim 1, further comprising fixing a lens module on the substrate, wherein the lens module comprises a lens holder and a lens, and the lens is aligned to a sensing region of the image chip.

3. The method for assembling the camera module as claimed in claim 1, wherein the large conductive bump is flattened by a pressing head to form the top plane.

4. The method for assembling the camera module as claimed in claim 1, further comprising a step of putting a third conductive bump on the pad of the image chip before pressing the substrate and the image chip together, wherein all conductive bumps have a combined total height greater than the surface height of the burr.

5. The method for assembling the camera module as claimed in claim 4, when the substrate and the image chip are pressed together, the third conductive bump is aligned to and contacts with the top plane, and thus the third conductive bump is electrically connected with the large conductive bump due to the conjunction therebetween, and accordingly the conductive contact is electrically connected with the pad.

6. The method for assembling the camera module as claimed in claim 1, wherein the substrate is a rigid-flex printed circuit board, a copper foil substrate or a ceramic substrate.

7. The method for assembling the camera module as claimed in claim 6, wherein the rigid-flex printed circuit board comprises a first hard circuit board, a second hard circuit board and a soft circuit board disposed between the first hard circuit board and the second hard circuit board, and the conductive contact is disposed on the first hard circuit board.

* * * * *